(12) United States Patent
Qing et al.

(10) Patent No.: US 12,029,088 B2
(45) Date of Patent: Jul. 2, 2024

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Haigang Qing, Beijing (CN); Ziyang Yu, Beijing (CN); Wenbo Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 472 days.

(21) Appl. No.: 17/456,881

(22) Filed: Nov. 29, 2021

(65) Prior Publication Data
US 2022/0310772 A1 Sep. 29, 2022

(30) Foreign Application Priority Data
Mar. 25, 2021 (CN) .......................... 202110323225.0

(51) Int. Cl.
*H10K 59/131* (2023.01)
*G09G 3/3225* (2016.01)
*G09G 3/3266* (2016.01)

(52) U.S. Cl.
CPC ....... *H10K 59/1315* (2023.02); *G09G 3/3225* (2013.01); *G09G 3/3266* (2013.01);
(Continued)

(58) Field of Classification Search
CPC ............ H10K 59/1315; G09G 3/3225; G09G 3/3266; G09G 2300/0408;
(Continued)

(56) References Cited

U.S. PATENT DOCUMENTS 6,720,944 B1 * 4/2004 Ishii ...................... G02F 1/1339
345/87
2019/0013378 A1 * 1/2019 Wang ................... H10K 59/126
(Continued)

FOREIGN PATENT DOCUMENTS

CN 108598118 A 9/2018
CN 110190103 A 8/2019
(Continued)

*Primary Examiner* — Binh B Tran
(74) *Attorney, Agent, or Firm* — Kinney & Lange, P.A.

(57) ABSTRACT

A display substrate includes a base substrate including a display area and a peripheral area located at least on a first side of the display area. A plurality of pixel units are arranged in the display area. A first power trace is located in the peripheral area. A scan driving circuit is located in the peripheral area. The scan driving circuit includes a first scan driving circuit and a second scan driving circuit. A layer where the first power trace is located is located on a side of a layer where the scan driving circuit is located away from the base substrate. An orthographic projection of the first power trace on the base substrate at least partially overlaps an orthographic projection of the first scan driving circuit on the base substrate, and at least partially overlaps an orthographic projection of the second scan driving circuit on the base substrate.

15 Claims, 7 Drawing Sheets

(52) U.S. Cl.
CPC ............... *G09G 2300/0408* (2013.01); *G09G 2300/0842* (2013.01); *G09G 2310/0286* (2013.01); *G09G 2310/08* (2013.01)

(58) Field of Classification Search
CPC ... G09G 2300/0842; G09G 2310/0286; G09G 2310/08
USPC ........................................................ 361/794
See application file for complete search history.

(56) References Cited

U.S. PATENT DOCUMENTS

| | | |
|---|---|---|
| 2022/0068212 A1 | 3/2022 | Yao et al. |
| 2023/0363220 A1 | 11/2023 | Tian et al. |

FOREIGN PATENT DOCUMENTS

| | | |
|---|---|---|
| CN | 111816691 A | 10/2020 |
| JP | 2008216975 A | 9/2008 |

* cited by examiner

DISPLAY SUBSTRATE AND DISPLAY DEVICE

CROSS-REFERENCE TO RELATED APPLICATION

This application claims the benefit of Chinese Patent Application No. 202110323225.0 filed on Mar. 25, 2021 in the State Intellectual Property Office of China, the whole disclosure of which is incorporated herein by reference.

TECHNICAL FIELD

The present disclosure relates to a field of a display technology, and in particular to a display substrate and a display device.

BACKGROUND

With a development of an electronic technology, display devices such as smart phones are used more and more frequently in users' lives, and become more and more important to users. A large-screen mobile phone may have a large display area, which is more in line with users' needs of browsing web pages, reading books, watching movies, playing games, and so on. Therefore, a frame of a current display device is getting narrower and narrower, so as to increase a screen-to-body ratio and improve user experience.

The above information disclosed in this section is only for the understanding of the background of a technical concept of the present disclosure. Therefore, the above information may contain information that does not constitute a related art.

SUMMARY

In an aspect, there is provided a display substrate, including: a base substrate including a display area and a peripheral area located at least on a first side of the display area; a plurality of pixel units arranged in the display area of the base substrate, wherein the pixel unit includes a pixel driving circuit and a light emitting device electrically connected to the pixel driving circuit, and the light emitting device includes a first electrode; a first power trace located in the peripheral area and electrically connected to the first electrode; and a scan driving circuit arranged on the base substrate and located in the peripheral area, wherein the scan driving circuit includes a first scan driving circuit for generating a first scan signal and a second scan driving circuit for generating a second scan signal, wherein a layer where the first power trace is located is located on a side of a layer where the scan driving circuit is located away from the base substrate; and an orthographic projection of the first power trace on the base substrate at least partially overlaps an orthographic projection of the first scan driving circuit on the base substrate, and the orthographic projection of the first power trace on the base substrate at least partially overlaps an orthographic projection of the second scan driving circuit on the base substrate.

According to some exemplary embodiments, the second scan driving circuit is located on a side of the first scan driving circuit away from the display area, and the orthographic projection of the first power trace on the base substrate covers the orthographic projection of the second scan driving circuit on the base substrate.

According to some exemplary embodiments, a width of an overlapping portion of the orthographic projection of the first power trace on the base substrate and the orthographic projection of the first scan driving circuit on the base substrate in a first direction is more than 40% of a width of the first scan driving circuit in the first direction, wherein the first direction is a direction from the display area to the peripheral area.

According to some exemplary embodiments, the first scan driving circuit is spaced apart from the second scan driving circuit, and the orthographic projection of the first power trace on the base substrate covers an orthographic projection of a gap between the first scan driving circuit and the second scan driving circuit on the base substrate.

According to some exemplary embodiments, the first scan driving circuit is spaced apart from the second scan driving circuit; the first power trace includes a first sub-trace and a second sub-trace, and the first sub-trace is spaced apart from the second sub-trace; and a gap between the first sub-trace and the second sub-trace exposes a gap between the first scan driving circuit and the second scan driving circuit.

According to some exemplary embodiments, the display substrate further includes a conductive connecting portion located at least partially between the layer where the first power trace is located and a layer where the first electrode is located, so as to electrically connect the first power trace and the first electrode.

According to some exemplary embodiments, an orthographic projection of the conductive connecting portion on the base substrate at least partially overlaps the orthographic projection of the first scan driving circuit on the base substrate, and the orthographic projection of the conductive connecting portion on the base substrate covers the orthographic projection of the second scan driving circuit on the base substrate.

According to some exemplary embodiments, the conductive connecting portion is in contact with the first power trace, and a width of a portion of the first power trace in contact with the conductive connecting portion in the first direction is more than 50% of a width of the first power trace in the first direction, wherein the first direction is a direction from the display area to the peripheral area.

According to some exemplary embodiments, the display substrate further includes a first barrier component arranged on a side of the first power trace away from the base substrate, wherein an orthographic projection of the first barrier component on the base substrate at least partially overlaps the orthographic projection of the second scan driving circuit on the base substrate.

According to some exemplary embodiments, the second scan driving circuit includes an edge portion away from the display area, and the orthographic projection of the first barrier component on the base substrate is located on a side of an orthographic projection of the edge portion on the base substrate close to the display area.

According to some exemplary embodiments, the display substrate further includes a second barrier component arranged on a side of the first power trace away from the base substrate, wherein the second barrier component is located on a side of the first barrier component away from the display area; and an orthographic projection of the second barrier component on the base substrate at least partially overlaps an orthographic projection of the edge portion of the second scan driving circuit on the base substrate.

According to some exemplary embodiments, the display substrate further includes a conductive trace located in the peripheral area, wherein the conductive trace is located on a side of the second scan driving circuit away from the display area and is located on a side of the first power trace close to the base substrate, and the conductive trace is electrically connected to the first power trace.

According to some exemplary embodiments, the light emitting device further includes a second electrode and a light emitting layer arranged between the first electrode and the second electrode, the scan driving circuit includes at least one thin film transistor arranged on the base substrate, and the thin film transistor includes an active layer, a gate electrode, a source electrode and a drain electrode; and wherein the display substrate further includes: a first conductive layer arranged on a side of the active layer away from the base substrate, wherein the gate electrode is located in the first conductive layer; a second conductive layer arranged on a side of the first conductive layer away from the base substrate, wherein the source electrode and the drain electrode are located in the second conductive layer; and a third conductive layer arranged on a side of the second conductive layer away from the base substrate, wherein at least a portion of the second power trace is located in the second conductive layer and/or the third conductive layer.

According to some exemplary embodiments, the first electrode is a cathode electrode of an organic light emitting device, and the second electrode is an anode electrode of the organic light emitting device.

In another aspect, there is provided a display device including the display substrate described above.

BRIEF DESCRIPTION OF THE DRAWINGS

By describing in detail exemplary embodiments of the present disclosure with reference to the drawings, the features and advantages of the present disclosure will become more apparent.

DETAILED DESCRIPTION OF EMBODIMENTS

In order to make the objectives, technical solutions and advantages of the present disclosure more apparent, the technical solutions of the embodiments of the present disclosure are clearly and completely described below with reference to the drawings. Obviously, the described embodiments are only a part but not all of the embodiments of the present disclosure. Based on the embodiments of the present disclosure, all other embodiments obtained by those ordinary skilled in the art without carrying out inventive effort fall within the protection scope of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

Those skilled in the art should understand that in the present disclosure, unless otherwise specified, the expression "height" or "thickness" refers to a size in a direction perpendicular to a surface of each film layer arranged in the display substrate, that is, a size in the light emitting direction of the display substrate, or called a size in a normal direction of the display device.

In the present disclosure, unless otherwise specified, the expression "patterning process" generally includes steps of photoresist coating, exposure, development, etching, and photoresist stripping. The expression "one-time patterning process" means a process of forming patterned layers, components, members and so on by using one mask.

It should be noted that the expressions "same layer", "arranged in the same layer" or similar expressions refer to a layer structure formed by using the same film forming process to form a film layer for forming a specific pattern, and then using the same mask to pattern the film layer by using one-time patterning process. Depending on the specific patterns, the one-time patterning process may include multiple exposure, development or etching processes, and the specific pattern in the layer structure formed may be continuous or discontinuous. These specific patterns may also be at different heights or have different thicknesses.

In the present disclosure, unless otherwise specified, the expression "electrically connected" may mean that two components or elements are directly electrically connected. For example, component or element A is in direct contact with component or element B, and electrical signals may be transmitted between the two components or elements. It may also mean that two components or elements are electrically connected through a conductive medium such as a conductive wire. For example, component or element A is electrically connected to component or element B through a conductive wire so as to transmit electrical signals between the two components or elements. Alternatively, it may also mean that two components or elements are electrically connected through at least one electronic component. For example, component or element A is electrically connected to component or element B through at least one thin film transistor so as to transmit electrical signals between the two components or elements.

The embodiments of the present disclosure provide at least a display substrate and a display device. The display substrate includes: a base substrate including a display area and a peripheral area located at least on a first side of the display area; a plurality of pixel units arranged in the display area of the base substrate, wherein the pixel unit includes a pixel driving circuit and a light emitting device electrically connected to the pixel driving circuit, and the light emitting device includes a first electrode; a first power trace located in the peripheral area and electrically connected to the first electrode; a scan driving circuit arranged on the base substrate and located in the peripheral area, wherein the scan driving circuit includes a first scan driving circuit for generating a first scan signal and a second scan driving circuit for generating a second scan signal, and a layer where the first power trace is located is located on a side of a layer where the scan driving circuit is located away from the base substrate; and an orthographic projection of the first power trace on the base substrate at least partially overlaps an orthographic projection of the first scan driving circuit on the base substrate, and the orthographic projection of the first power trace on the base substrate at least partially overlaps an orthographic projection of the second scan driving circuit on the base substrate. In the embodiments of the present disclosure, in the peripheral area, the first power trace and the scan driving circuit are stacked, which is beneficial to achieve a display device with a narrow frame.

Figure 1:
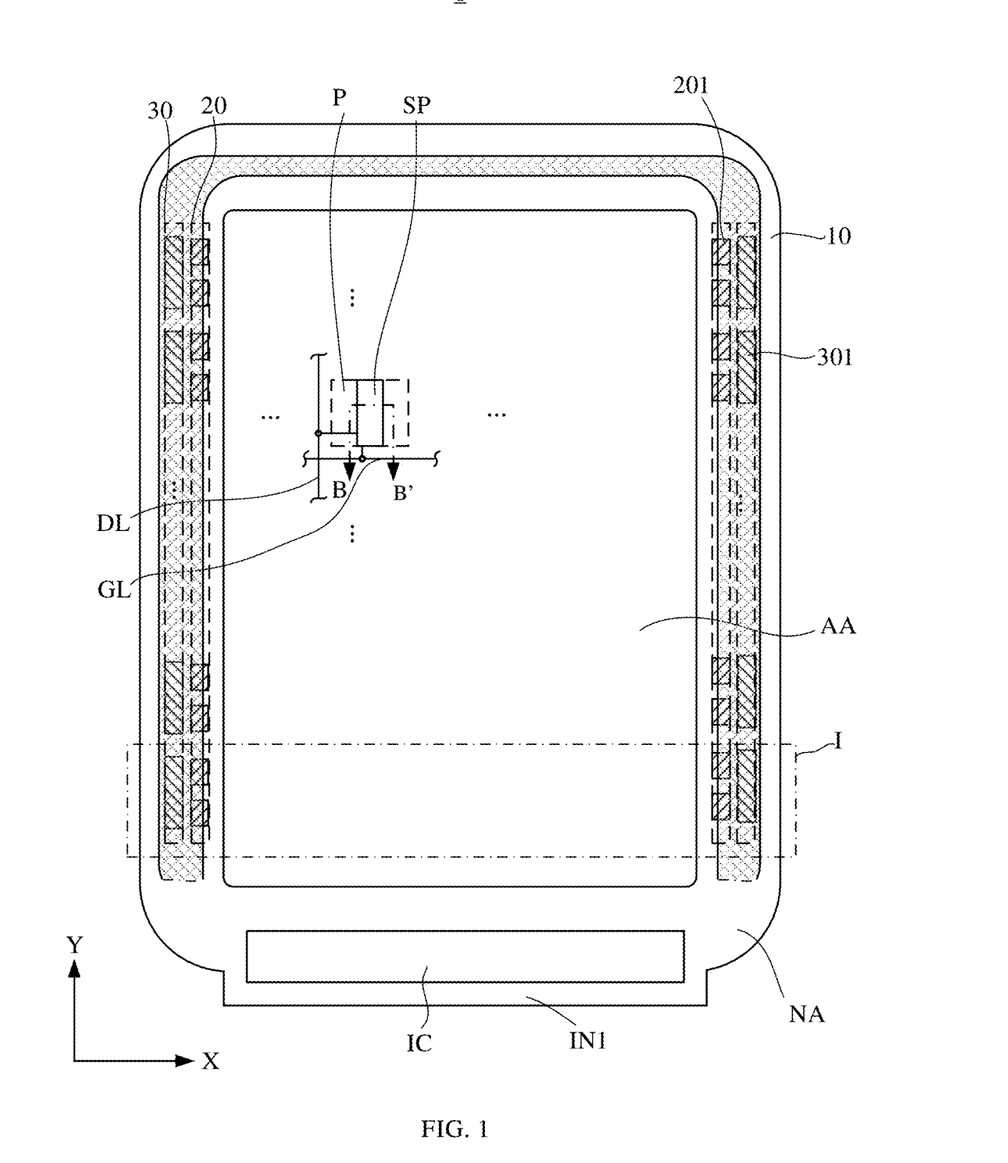
FIG. 1 shows a plan view of a display substrate according to some exemplary embodiments of the present disclosure.
Figure 2:
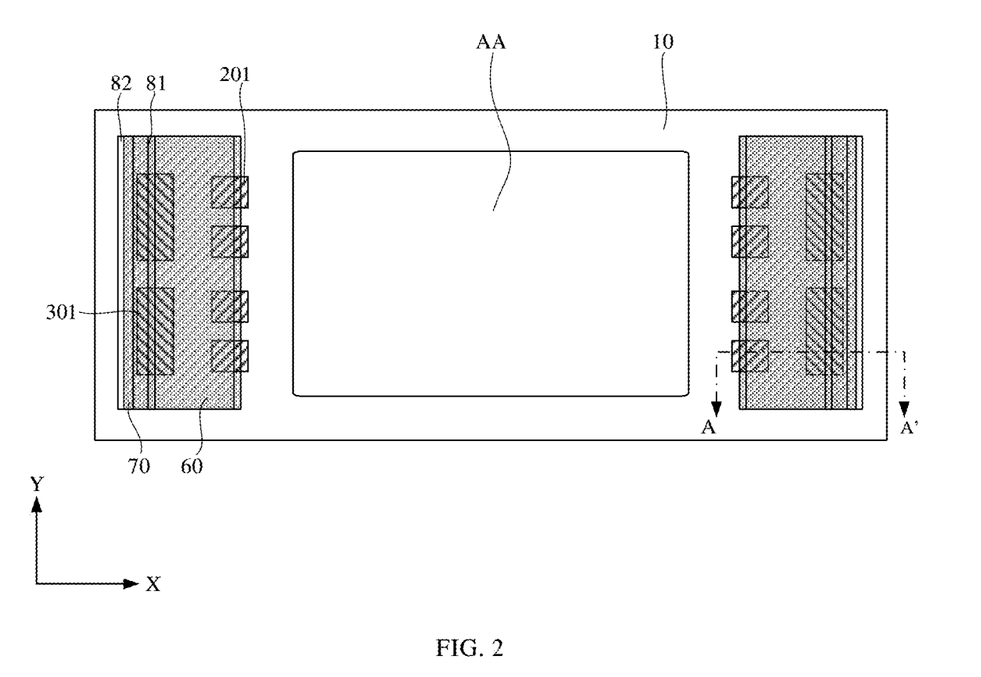
FIG. 2 shows a partial plan view of the display substrate according to some exemplary embodiments of the present disclosure at part I in FIG. 1.
Figure 3:
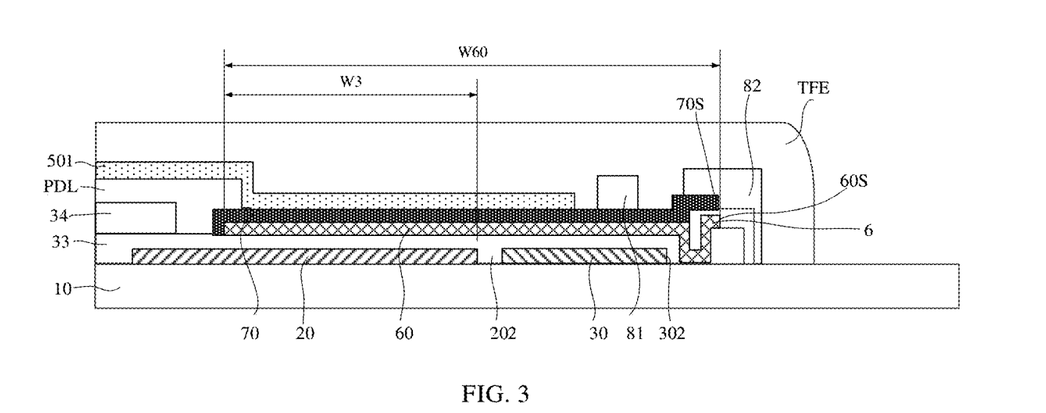
FIG. 3 shows a cross-sectional view of the display substrate according to some exemplary embodiments of the present disclosure taken along line AA' in FIG. 2.
Figure 4:
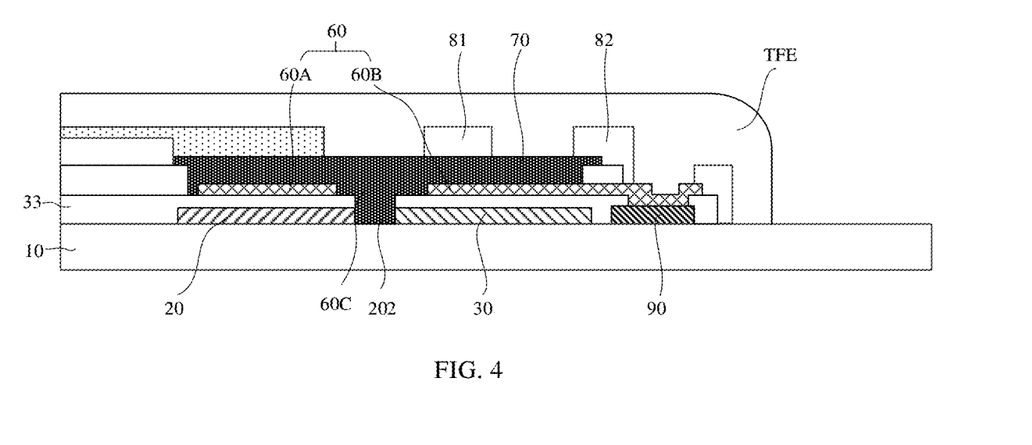
FIG. 4 shows a cross-sectional view of the display substrate according to other exemplary embodiments of the present disclosure taken along line AA' in FIG. 2.
Figure 5:
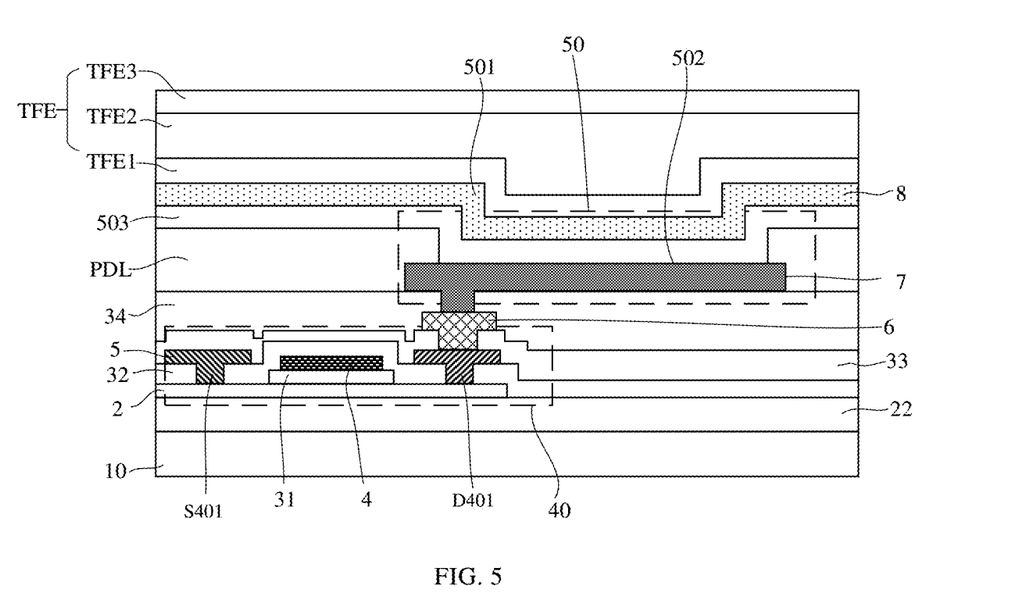
FIG. 5 shows a cross-sectional view of the display substrate according to some exemplary embodiments of the present disclosure taken along line BB' in FIG. 1.

FIG. 1 shows a plan view of a display substrate according to some exemplary embodiments of the present disclosure. FIG. 2 shows a partial plan view of the display substrate according to some exemplary embodiments of the present disclosure at part I in FIG. 1. FIG. 3 shows a cross-sectional view of the display substrate according to some exemplary embodiments of the present disclosure taken along line AA' in FIG. 2. FIG. 4 shows a cross-sectional view of the display substrate according to other exemplary embodiments of the present disclosure taken along line AA' in FIG. 2. FIG. 5 shows a cross-sectional view of the display substrate according to some exemplary embodiments of the present disclosure taken along line BB' in FIG. 1. Referring to FIG. 1 to FIG. 5, the display substrate 1 may include a base substrate 10. For example, the base substrate 10 may be formed of glass, plastic, polyimide, or other materials. The base substrate 10 includes a display area AA and a peripheral area (or referred to as a non-display area) NA located on at least one side of the display area AA.

Referring to FIG. 1, the display substrate 1 may include a plurality of pixel units P (schematically shown by a dashed box in FIG. 1) arranged in the display area AA. The plurality of pixel units P may be arranged in an array in a first direction X and a second direction Y on the base substrate 10. Each of the pixel units P may further include a plurality of sub-pixels, such as a red sub-pixel, a green sub-pixel and a blue sub-pixel. A sub-pixel SP is schematically shown in FIG. 1.

For example, the display substrate may include a signal input side IN1 (a lower side shown in FIG. 1). A data driving chip IC may be provided on the signal input side IN1. The data driving chip IC may be electrically connected to the pixel unit P located in the display area through a plurality of signal traces, and the pixel driving circuit may be electrically connected to the data driving chip IC. In this way, a signal such as a data signal may be transmitted from the signal input side IN1 to the plurality of pixel units P.

For example, as shown in FIG. 1, the peripheral area NA may be located on four sides of the display area AA, that is, the peripheral area NA surrounds the display area AA.

It should be noted that in the drawings, the pixel unit and the sub-pixel are schematically shown in a rectangular shape, but this does not constitute a limitation on the shape of the pixel unit and the sub-pixel included in the display substrate provided by the embodiments of the present disclosure.

Exemplarily, the display substrate 1 may include a scan driving circuit arranged on the base substrate 10 and located in the peripheral area NA. For example, the scan driving circuit may include a plurality of scan driving shift register units connected in cascade.

Referring to FIG. 1, the scan driving circuit may include a first scan driving circuit 20 for generating a first scan signal and a second scan driving circuit 30 for generating a second scan signal. For example, the first scan signal may be a gate scanning signal, and the first scan driving circuit may be a gate scan driving circuit (Gate GOA); the second scan signal may be a light emission control scan signal, and the second scan driving circuit may be a light emission control scan driving circuit (EM GOA). Exemplarily, the first scan driving circuit 20 may include a plurality of gate scanning shift register units 201 connected in cascade for providing the plurality of pixel units P with, for example, gate scanning signals shifted row by row. The second scan driving circuit 30 may include a plurality of light emission control scanning shift register units 301 connected in cascade for providing the plurality of pixel units P with, for example, light emission control signals shifted row by row.

In a GOA technology, a gate driving circuit and a light emission control scan driving circuit are directly arranged on the array substrate, instead of using an external driving chip. For example, each GOA unit may act as a stage of shift register unit, and each stage of shift register unit may be electrically connected to a gate line or a light emission control line. Each stage of shift register unit may output a turn-on voltage in turn, so as to achieve a progressive scanning of the pixel units. In some embodiments, each stage of shift register unit may also be connected to a plurality of gate lines or a plurality of light emission control lines. This may adapt to a development trend of high resolution and narrow frame of a display panel.

In the embodiments of the present disclosure, each pixel unit P may include a pixel driving circuit 40 and a light emitting device 50 electrically connected to the pixel driving circuit. For example, the light emitting device 50 may be an organic light emitting diode (OLED) or a quantum dot light emitting diode (QLED). Referring to FIG. 5, the light emitting device 50 may include a first electrode 501, a second electrode 502, and a light emitting layer 503 arranged between the first electrode and the second electrode.

One of the first electrode 501 and the second electrode 502 is an anode electrode, and the other is a cathode electrode. For example, the first electrode 501 may be the cathode electrode, and the second electrode 502 may be the anode electrode. The light emitting layer 503 may have a multilayer structure, for example, it may include a multilayer structure including a hole injection layer, a hole transport layer, an organic light emitting layer, an electron transport layer and an electron injection layer.

It should be noted that for example, an active drive or a passive drive may be adopted for the light emitting device 50 of the organic light emitting diode. A passive drive OLED array substrate includes a cathode electrode and an anode electrode, an intersection of the anode electrode and the cathode electrode may emit light, and the driving circuit may be externally mounted by a connecting method such as a tape carrier package or a chip-on-glass. An active drive OLED array substrate may provide each pixel with a pixel driving circuit. The pixel driving circuit may include a thin film transistor with a switching function (that is, a switching transistor), a thin film transistor with a driving function (that is, a driving transistor), and a charge storage capacitor. In addition, the pixel driving circuit may further include other types of thin film transistor with a compensation function. It should be understood that, in the embodiments of the present disclosure, the display substrate may be provided with various types of existing pixel driving circuits, which will not be repeated here. For example, each pixel unit P may include a pixel driving circuit having a circuit structure of 7T1C, 7T2C, 8T2C or 4T1C. The pixel driving circuit may operate under the control of a data signal transmitted through the data line and a gate scanning signal and a light emission control signal transmitted through the signal line, so as to drive the light emitting device to emit light, and thus realize display and other operations.

For example, as shown in FIG. 5, the display substrate 1 may include a driving circuit layer. The pixel driving circuit described above may be arranged in the driving circuit layer.

An insulating layer may be provided between the driving circuit layer and the light emitting device 50. The insulating layer may be a single insulating film layer or a stacked layer including a plurality of insulating film layers.

For example, the display substrate 1 may further include various signal lines arranged on the base substrate 10. The various signal lines may include a data line, a gate scanning signal line, a light emission control signal line, a first power trace, a second power trace and so on, so as to provide various signals such as a data signal, a gate scanning signal, a light emission control signal, a first power supply voltage, a second power supply voltage and so on to the pixel driving circuit in each sub-pixel. In the embodiment shown in FIG. 1, a scan line GL and a data line DL are schematically shown. The scan line GL and the data line DL may be electrically connected to each pixel unit P.

Referring to FIG. 3 to FIG. 5, the display substrate 1 may include: a semiconductor layer 2 arranged on the base substrate 10, a first insulating layer 31 arranged on a side of the semiconductor layer 2 away from the base substrate 1, a first conductive layer 4 arranged on a side of the first insulating layer 31 away from the base substrate 10, a second insulating layer 32 arranged a side of the first conductive layer 4 away from the base substrate 10, a second conductive layer 5 arranged on a side of the second insulating layer 32 away from the base substrate 10, a third insulating layer 33 arranged on a side of the second conductive layer 5 away from the base substrate 10, a third conductive layer 6 arranged on a side of the third insulating layer 33 away from the base substrate 10, a fourth insulating layer 34 arranged on a side of the third conductive layer 6 away from the base substrate, a fourth conductive layer 7 arranged on a side of the fourth insulating layer 34 away from the base substrate 10, a pixel defining layer PDL arranged on a side of the fourth conductive layer 7 away from the base substrate 10, a light emitting layer 503 arranged on a side of the pixel defining layer PDL away from the base substrate 10, and a fifth conductive layer 8 arranged on a side of the light emitting layer 503 away from the base substrate 10.

Optionally, a film layer 22 such as a buffer layer and a barrier layer may be further provided between the base substrate 10 and the semiconductor layer 2.

For example, in the display area AA, the pixel driving circuit 40 may include a plurality of thin film transistors, and each thin film transistor may include an active layer, a gate electrode, a source electrode and a drain electrode. For example, FIG. 5 schematically shows a thin film transistor as well as an active layer, a gate electrode, a source electrode 5401 and a drain electrode D401 thereof. The active layer of the thin film transistor of the pixel driving circuit 40 is located in the semiconductor layer 2, the gate electrode is located in the first conductive layer 4, and the source electrode 5401 and the drain electrode D401 are located in the second conductive layer 5. For example, the drain electrode D401 may be electrically connected to the second electrode 502 through a conductive connecting portion located in the third conductive layer 6.

For example, the first insulating layer 31 may include a gate insulating layer, the second insulating layer 32 may include an interlayer dielectric layer, the third insulating layer 33 may include a passivation layer and/or a first planarization layer, and the fourth insulating layer 34 may include a second planarization layer. For another example, each of the first insulating layer 31, the second insulating layer 32, the third insulating layer 33 and the fourth insulating layer 34 may include a single-layer film structure or a stacked-layer film structure. The first insulating layer 31 and the second insulating layer 32 may contain an inorganic insulating material. The third insulating layer 33 and the fourth insulating layer 34 may contain an inorganic insulating material, an organic insulating material, or any combination thereof. For example, the inorganic insulating material may include silicon oxide, silicon nitride, silicon oxynitride, and the like. The organic insulating material may include polyimide, polyamide, acrylic resin, phenol resin, benzocyclobutene, and the like.

For example, the second electrode 502 may be located in the fourth conductive layer 7, and the first electrode 501 may be located in the fifth conductive layer 8.

In the display area AA, the pixel defining layer PDL may include an opening located in each sub-pixel. The opening may expose a portion of the second electrode 502. A portion of the light emitting layer 503 fills the opening and is in contact with the exposed portion of the second electrode 502. The first electrode 501 is located on a side of the light emitting layer 503 away from the base substrate 10.

Exemplarily, the first conductive layer may be a conductive layer made of a gate material, the second conductive layer and the third conductive layer may be a conductive layer made of a source/drain material, the fourth conductive layer may be a conductive layer made of an anode material, and the fifth conductive layer may be a conductive layer made of a cathode material.

For example, the gate material may include a metal material, such as Mo, Al, Cu and other metals and alloys thereof. The source/drain material may include a metal material, such as Mo, Al, Cu and other metals and alloys thereof, or Ti/Al/Ti and other materials. The anode material may include a conductive metal material, such as magnesium, aluminum, lithium and other metals and alloys thereof, or indium tin oxide (ITO), indium zinc oxide (IZO), and the like. The cathode material may include a transparent conductive material, such as indium tin oxide (ITO), indium zinc oxide (IZO), and the like.

For example, the first power trace may be a trace for providing a VSS voltage signal, and the second power trace may be a trace for providing a VDD voltage signal. For example, the first power trace is electrically connected to the first electrode 501, and the second power trace is electrically connected to the second electrode 502. It should be noted that "the second power trace is electrically connected to the second electrode" here may mean that the second power trace is electrically connected to the second electrode through an electronic component such as the thin film transistor in the pixel driving circuit.

Referring to FIG. 2, FIG. 3 and FIG. 4, in the embodiments of the present disclosure, the scan driving circuit and the first power trace are both arranged in the peripheral area NA, and a stacked-layer design is adopted for the scan driving circuit and the power trace in the peripheral area. That is, an orthographic projection of the first power trace on the base substrate at least partially overlaps an orthographic projection of the scan driving circuit on the base substrate. Specifically, the first scan driving circuit 20, the second scan driving circuit 30 and the first power trace 60 are all arranged in the peripheral area NA. An orthographic projection of the first power trace 60 on the base substrate 10 at least partially overlaps an orthographic projection of the first scan driving circuit 20 on the base substrate 10, and the orthographic projection of the first power trace 60 on the base substrate 10 at least partially overlaps an orthographic projection of the second scan driving circuit 30 on the base substrate 10. Through this stacked-layer design, a space of the peripheral area in a thickness direction of the display substrate may be fully utilized to arrange the first power trace, so as to reduce an occupation width of the first power trace in the peripheral area, which may reduce a width of a frame of the display substrate and facilitate the realization of a display device with a narrow frame.

It should be noted that the first power trace 60 is used to transmit the VSS voltage signal, and the first power trace 60 may have a large width to reduce a resistance of the first power trace 60, so as to reduce a voltage drop generated during a transmission of the VSS voltage signal on the first power trace 60. In the embodiments of the present disclosure, the first power trace 60 with the large width is stacked with the scan driving circuit. In this way, the first power trace 60 with the large width may be avoided to be arranged side by side with the scan driving circuit. Therefore, the stacked-layer design may greatly reduce the occupation width of the first power trace in the peripheral area, so that the width of the frame of the display substrate may be reduced.

As described above, the first scan driving circuit 20 may include a plurality of gate scanning shift register units 201 connected in cascade for providing the plurality of pixel units P with, for example, gate scanning signals shifted row by row.

Figure 6:
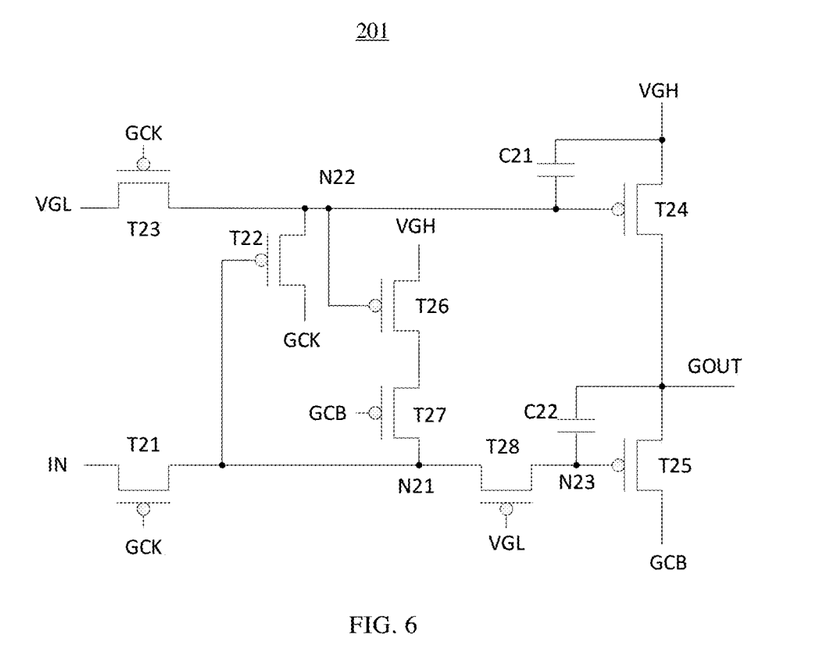
FIG. 6 shows a circuit diagram of a gate scanning shift register unit included in a first scan driving circuit according to some exemplary embodiments of the present disclosure.
Figure 7:
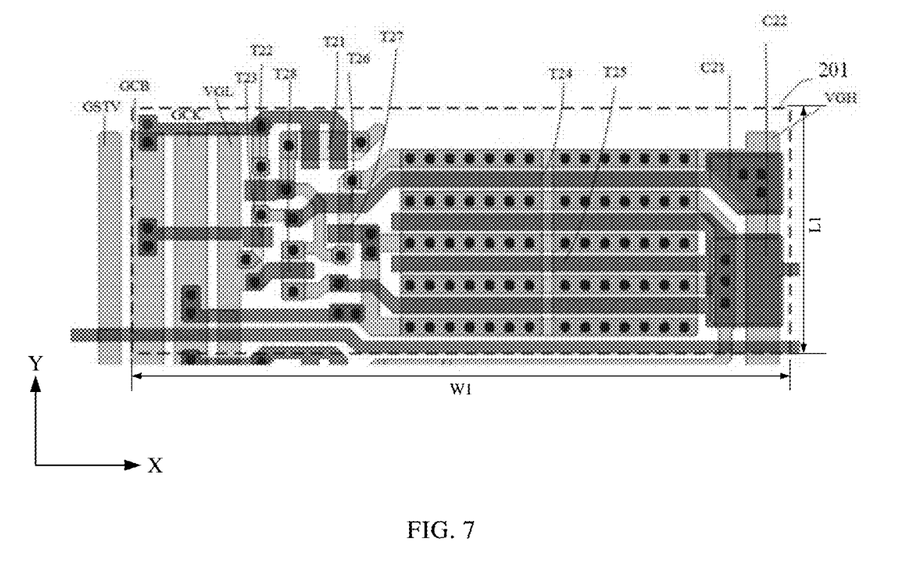
FIG. 7 shows a schematic diagram of a layout of the gate scanning shift register unit included in the first scan driving circuit on the base substrate according to some exemplary embodiments of the present disclosure.

FIG. 6 shows a circuit diagram of a gate scanning shift register unit 201 included in the first scan driving circuit 20 according to some exemplary embodiments of the present disclosure. FIG. 7 shows a schematic diagram of a layout of the gate scanning shift register unit 201 included in the first scan driving circuit 20 on the base substrate according to some exemplary embodiments of the present disclosure.

Referring to FIG. 6 and FIG. 7, the gate scanning shift register unit 201 may include eight transistors (an input transistor T21, a first control transistor T22, a second control transistor T23, an output control transistor T24, a gate output transistor T25, a first noise reduction transistor T26, a second noise reduction transistor T27, and a voltage stabilization transistor T28) and two capacitors (a first scanning capacitor C21 and a second scanning capacitor C22). For example, when the plurality of gate scanning shift register units 201 are connected in cascade, a first electrode of the input transistor T21 in a first stage of gate scanning shift register unit 201 is connected to an input terminal IN, and the input terminal IN is connected to a trigger signal line GSTV so as to receive a trigger signal as an input signal. The first electrode of the input transistor T21 in other stage of gate scanning shift register unit 201 is connected to the output terminal of a previous stage of gate scanning shift register unit 201, so as receive an output signal output by an output terminal GOUT of the previous stage of gate scanning shift register unit 201 as an input signal. In this way, a shift output may be achieved to scan the array of pixel units located in the display area row by row.

For example, the input transistor T21 has a gate electrode connected to a first sub-clock signal line GCK, a second electrode connected to the input terminal IN, and a first electrode connected to a first scan node N21. The first control transistor T22 has a gate electrode connected to a first scan node N21, a second electrode connected to the first sub-clock signal line GCK, and a first electrode connected to a second scan node N22. The second control transistor T23 has a gate electrode connected to the first sub-clock signal line GCK, a second electrode connected to a second power signal line VGL, and a first electrode connected to the second scan node N22. The output control transistor T24 has a gate electrode connected to the second scan node N22, a first electrode connected to a third power line VGH, and a second electrode connected to the output terminal GOUT. The first scanning capacitor C21 has a first electrode connected to the second scan node N22, and a second electrode connected to the third power line VGH. The gate output transistor T25 has a gate electrode connected to the third scan node N23, a first electrode connected to a second sub-clock signal line GCB, and a second electrode connected to the output terminal GOUT. The second scanning capacitor C22 has a first electrode connected to a third scan node N23, and a second electrode connected to the output terminal GOUT. The first noise reduction transistor T26 has a gate electrode connected to the second scan node N22, a first electrode connected to the third power line VGH, and a second electrode connected to a second electrode of the second noise reduction transistor T27. The second noise reduction transistor T27 has a gate electrode connected to the second sub-clock signal line GCB, and a first electrode connected to the first scan node N21. The voltage stabilization transistor T28 has a gate electrode connected to the second power line VGL, a second electrode connected to the first scan node N21, and a first electrode connected to the third scan node N23.

A P-type transistor is illustrated by way of example in describing the transistors in the gate scanning shift register unit 201 shown in FIG. 6. That is, each transistor is turned on when the gate electrode is connected to a low level (a turn-on level), and is turned off when the gate electrode is connected to a high level (a turn-off level). In this case, the first electrode of the transistor may be the source electrode, and the second electrode of the transistor may be the drain electrode.

It should be noted that, in the embodiments of the present disclosure, the gate scanning shift register unit includes but is not limited to the configuration shown in FIG. 6 and FIG. 7. For example, the capacitor C22 in the gate scanning shift register unit 201 may be connected between the second scan node N22 and the second sub-clock signal line GCB, and the node N22 may be provided with a transistor, such as the voltage stabilization transistor T28, and other transistor with a similar function. The various transistors may also be N-type transistors, or a mixture of P-type transistor and N-type transistor may be adopted, as long as a port polarity of the selected type of transistor is connected according to the port polarity of the corresponding transistor in the embodiments of the present disclosure.

It should be noted that an operation principle of the gate scanning shift register unit may refer to an introduction in the art, which will not be repeated here.

For example, a gate scanning signal output by the gate scan driving circuit is maintained at an active level (for example, a low level) for a short time period of a frame so as to output to the pixel circuit. That is, the gate scan driving circuit may output an effective signal during a time period when the data signal should be written in the pixel in a frame. The light emission control signal output by the EM GOA may be maintained at an active level (for example, a low level) for a long time period in a frame so as to output to the pixel circuit, so that the pixel may be controlled to emit light in a long time period in the frame.

As described above, the second scan driving circuit 30 may include a plurality of light emission control scanning shift register units 301 connected in cascade for providing the plurality of pixel units P with, for example, light emission control signals shifted row by row.

Figure 8:
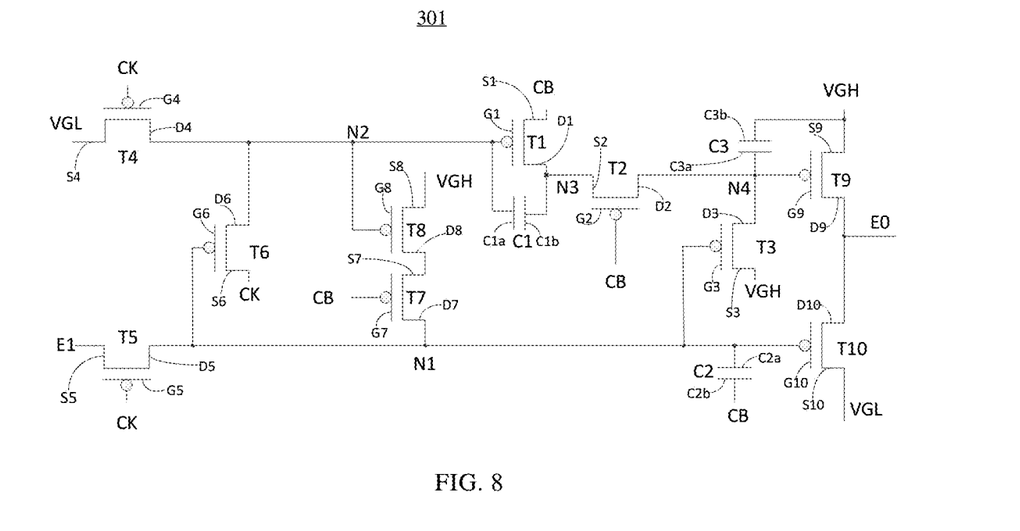
FIG. 8 shows a circuit diagram of a light emission control scanning shift register unit included in a second scan driving circuit according to some exemplary embodiments of the present disclosure.
Figure 9:
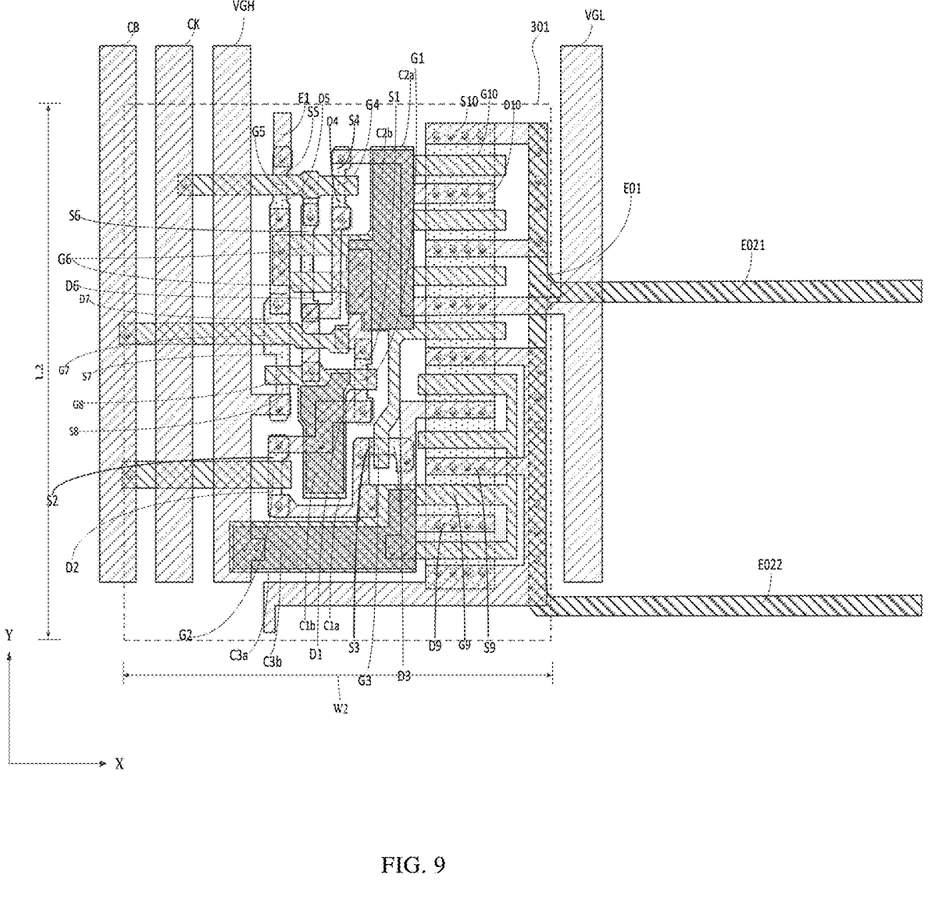
FIG. 9 shows a schematic diagram of a layout of the light emission control scanning shift register unit included in the second scan driving circuit on the base substrate according to some exemplary embodiments of the present disclosure.

FIG. 8 shows a circuit diagram of the light emission control scanning shift register unit 301 included in the second scan driving circuit 30 according to some exemplary embodiments of the present disclosure. FIG. 9 shows a schematic diagram of a layout of the light emission control scanning shift register unit 301 included in the second scan driving circuit 30 on the base substrate according to some exemplary embodiments of the present disclosure.

As shown in FIG. 8, in some embodiments, at least one shift register unit of the plurality of shift register units may include ten transistors and three capacitors, for example, including a first capacitor C1, an output capacitor C2, an output reset capacitor C3, an output transistor T10, an output reset transistor T9, a first transistor T1, a second transistor T2, a third transistor T3, a fourth transistor T4, a fifth transistor T5, a sixth transistor T6, a seventh transistor T7, and an eighth transistor T8.

The output transistor T10 has a gate electrode G10 coupled to a first plate C2a of the output capacitor C2, a first electrode S10 coupled to the second voltage signal line VGL, and a second electrode D10 coupled to a signal output line E0.

The output reset transistor T9 has a gate electrode G9 coupled to a first plate C3a of the output reset capacitor C3, a first electrode S9 coupled to a second plate C3b of the output reset capacitor C3, and a second electrode D9 coupled to the signal output line E0.

The output reset capacitor C3 has the second plate C3b coupled to the first voltage signal line VGH, and the output capacitor C2 has a second plate C2b coupled to a second clock signal line CB.

The first transistor T1 has a first electrode S1 coupled to the second clock signal line CB, a second electrode D1 of the first transistor T1 and a first electrode S2 of the second transistor T2 are respectively coupled to the second plate C1b of the first capacitor C1, and a gate electrode G1 of the first transistor T1 is coupled to the first plate C1a of the first capacitor C1.

A gate electrode G2 of the second transistor T2 and a gate electrode G7 of the seventh transistor T7 are respectively coupled to the first clock signal line CB, a second electrode D2 of the second transistor T2 is coupled to a second electrode D3 of the third transistor T3, and the first electrode S2 of the second transistor T2 is coupled to the second plate C1b of the first capacitor.

The third transistor T3 has a gate electrode G3 coupled to the gate electrode G10 of the output transistor T10, and a first electrode S3 coupled to the first voltage signal line VGH.

A gate electrode G4 of the fourth transistor T4 and a gate electrode G5 of the fifth transistor T5 are both coupled to the first clock signal line CK, a first electrode S4 of the fourth transistor T4 and the first electrode S10 of the output transistor T10 are both coupled to the second voltage signal line VGL, and a second electrode D4 of the fourth transistor T4 is coupled to a second electrode D6 of the sixth transistor T6.

The fifth transistor T5 has the gate electrode G5 coupled to the first clock signal line CK, a second electrode D5 coupled to a gate electrode G6 of the sixth transistor T6, and a first electrode S5 coupled to an input signal terminal E1.

A first electrode S6 of the sixth transistor T6 and the gate electrode G4 of the fourth transistor T4 are both coupled to the first clock signal line CK, the second electrode D6 of the sixth transistor T6 is coupled to the second electrode D4 of the fourth transistor T4, and the gate electrode G6 of the sixth transistor T6 is coupled to the second electrode D5 of the fifth transistor T5.

The gate electrode G7 of the seventh transistor T7 and the second plate C2b of the output capacitor C2 are both coupled to the second clock signal line CB, a first electrode S7 of the seventh transistor T7 is coupled to a second electrode D8 of the eighth transistor T8, and a second electrode D7 of the seventh transistor T7 is coupled to the gate electrode G6 of the sixth transistor T6.

The eighth transistor T8 has a gate electrode G8 coupled to the gate electrode G1 of the first transistor T1, and a first electrode S8 coupled to the first voltage signal line VGH.

A P-type transistor is illustrated by way of example in describing the transistors in the light emission control scanning shift register unit 301 shown in FIG. 8. That is, each transistor is turned on when the gate electrode is connected to a low level (a turn-on level), and is turned off when the gate electrode is connected to a high level (a turn-off level). In this case, the first electrode of the transistor may be the source electrode, and the second electrode of the transistor may be the drain electrode.

It should be noted that, in the embodiments of the present disclosure, the light emission control scanning shift register unit includes but is not limited to the configuration shown in FIG. 8 and FIG. 9.

In FIG. 8, the first node is denoted by N1, the second node is denoted by N2, the third node is denoted by N3, and the fourth node is denoted by N4.

In the embodiments shown in FIG. 8 and FIG. 9, the first voltage signal line VGH may provide a high voltage Vgh, and the second voltage signal line VGL may provide a low voltage Vgl, but it is not limited to this.

As shown in FIG. 9, the shift register unit may include a first capacitor C1, an output capacitor C2, an output reset capacitor C3, an output transistor T10, an output reset transistor T9, a first transistor T1, a second transistor T2, a third transistor T3, a fourth transistor T4, a fifth transistor T5, a sixth transistor T6, a seventh transistor T7, and an eighth transistor T8.

The output transistor T10 and the output reset transistor T9 may be arranged in second direction Y. The output capacitor C2 is arranged on a side of the output transistor T10 away from the second voltage signal line VGL, and the transistors T5, T6 and T4 are arranged between the output capacitor C2 and the first voltage signal line VGH.

The transistors T1 and T3 are arranged on a side of the output reset transistor T9 away from the second voltage signal line VGL, the first capacitor C1 is arranged on a side of the third transistor T3 away from the output reset transistor T9, and the eighth transistor T8 and the second transistor T2 are arranged on a side of the first capacitor C1 away from the eighth transistor T8.

The transistors T5, T7, T8, T2 and the output reset capacitor C3 are arranged in sequence in the second direction Y, the sixth transistor T6 and the capacitors C1 and C3 are arranged in sequence in the second direction Y, and the output capacitor C2, the first transistor Ti, the third transistor T3 and the output reset capacitor C3 are arranged in sequence in the second direction Y.

In FIG. 9, a first output line portion of the signal output line is denoted by E01, a first second output line portion of the signal output line is denoted by E021, and a second second output line portion of the signal output line is denoted by E022. E01 extends in the second direction Y, E021 extends in the first direction X, and the output line portions E01, E021 and E022 are coupled to each other. The first direction X intersects the second direction Y. E01 is arranged between the second voltage signal line VGL and the output circuit (the output circuit includes the output transistor T10 and the output reset transistor T9), and the output line portions E021 and E022 extend toward the display area AA in the first direction X, so as to provide the light emission control signal to the pixel driving circuit located in the display area.

In FIG. 8 and FIG. 9, G1 represents the gate electrode of Ti, S1 represents the first electrode of Ti, and D1 represents the second electrode of Ti; G2 represents the gate electrode of T2, S2 represents the first electrode of T2, and D2 represents the second electrode of T2; G3 represents the gate electrode of T3, S3 represents the first electrode of T3, and D3 represents the second electrode of T3; G4 represents the gate electrode of T4, S4 represents the first electrode of T4, and D4 represents the second electrode of T4; G5 represents the gate electrode of T5, S5 represents the first electrode of T5, and D5 represents the second electrode of T5; G6 represents the gate electrode of T6, S6 represents the first electrode of T6, and D6 represents the second electrode of T6; G7 represents the gate electrode of T7, S7 represents the first electrode of T7, and D7 represents the second electrode of T7; G8 represents the gate electrode of T8, and S8 represents the first electrode of T8; G9 represents the gate electrode of T9, S9 represents the first electrode of T9, and D9 represents the second electrode of T9; G10 represents the gate electrode of T10, S10 represents the first electrode of T10, and D10 represents the second electrode of T10.

In the embodiment shown in FIG. 9, the first direction X may be a horizontal direction from right to left, and the second direction Y may be a vertical direction from top to bottom, but the embodiment of the present disclosure is not limited thereto. In practical operation, the first direction may also be a vertical direction from bottom to top, and the second direction may also be a horizontal direction from left to right. Alternatively, the first direction may also be other directions, and the second direction may also be other directions.

It should be noted that the shift register unit shown in FIG. 7 and FIG. 9 may be an n-th stage of shift register unit included in the scan driving circuit, where n is a positive integer.

In the embodiments of the present disclosure, an orthographic projection of a circuit on the base substrate may be represented by an occupation area of the circuit. The expression "occupation area of the circuit" refers to a largest area covered by an orthographic projection of various components (such as a plurality of transistors and a plurality of capacitors) included in the circuit on the base substrate. For example, the orthographic projection of the various components included in the circuit on the base substrate has two sides farthest apart in the first direction X and two sides farthest apart in the second direction Y. Extension lines of these four sides may cross to surround and form an area, which is the occupation area of the circuit.

Specifically, referring to FIG. 7, a schematic diagram of a layout of the shift register unit 201 included in the first scan driving circuit 20 on the display substrate is schematically shown. As described above, the shift register unit 201 may include eight transistors (an input transistor T21, a first control transistor T22, a second control transistor T23, an output control transistor T24, a gate output transistor T25, a first noise reduction transistor T26, a second noise reduction transistor T27, and a voltage stabilization transistor T28) and two capacitors (a first scanning capacitor C21 and a second scanning capacitor C22). Accordingly, the occupation area of a shift register unit 201 may be indicated by a largest area covered by an orthographic projection of a combination of the eight transistors and the two capacitors on the base substrate. As shown in FIG. 7, a dashed box is used to schematically show the occupation area of the shift register unit 201 included in the first scan driving circuit 20. The occupation area has a size in the first direction X (that is, a width W1) and a size in the second direction Y (that is, a length L1), and the occupation area has a rectangular shape. The first scan driving circuit 20 includes n shift register units 201. Accordingly, the orthographic projection of the first scan driving circuit 20 on the base substrate 10 may be represented by an occupation area formed by a combination of n dashed boxes as shown in FIG. 7.

Referring to FIG. 9, a schematic diagram of a layout of the shift register unit 301 included in the second scan driving circuit 30 on the display substrate is schematically shown. As described above, the shift register unit 301 may include ten transistors (an output transistor T10, an output reset transistor T9, a first transistor T1, a second transistor T2, a third transistor T3, a fourth transistor T4, a fifth transistor T5, a sixth transistor T6, a seventh transistor T7, and an eighth transistor T8) and three capacitors (a first capacitor C1, an output capacitor C2, and an output reset capacitor C3). Accordingly, the occupation area of the shift register unit 301 may be represented by a largest area covered by an orthographic projection of a combination of the ten transistors and the three capacitors on the base substrate. As shown in FIG. 9, a dashed box is used to schematically show the occupation area of the shift register unit 301 included in the second scan driving circuit 30. The occupation area has a size in the first direction X (that is, a width W2) and a size in the second direction Y (that is, a length L2), and the occupation area has a rectangular shape. The second scan driving circuit 30 includes n shift register units 301. Accordingly, the orthographic projection of the second scan driving circuit 30 on the base substrate 10 may be represented by an occupation area formed by a combination of n dashed boxes as shown in FIG. 9.

Exemplarily, referring to FIG. 1 to FIG. 9 in combination, in the peripheral area NA, the active layer of each transistor of the scan driving circuit may be located in the semiconductor layer 2, the gate electrode of each transistor of the scan driving circuit may be located in the first conductive layer 4, and the first electrode and the second electrode of each transistor of the scan driving circuit may be located in the second conductive layer 5. That is, the active layer, the gate electrode and the source/drain electrode of each transistor of the scan driving circuit located in the peripheral area NA are respectively located in the same layer as the active layer, the gate electrode and the source/drain electrode of each transistor of the pixel driving circuit located in the display area AA.

In the embodiments of the present disclosure, the first power trace 60 is located in the third conductive layer 6, that is, the layer where the first power trace 60 is located is located on a side of the layer where the scan driving circuit is located away from the base substrate 10. That is, the first power trace 60 and the scan driving circuit are located in different layers, which may facilitate the realization of the stacked-layer design of the first power trace 60 and the scan driving circuit.

For example, in the peripheral area NA, a part of the third insulating layer 33 is arranged between the first power trace 60 and the scan driving circuit.

In some embodiments of the present disclosure, referring to FIG. 1 and FIG. 3, the second scan driving circuit 30 is located on a side of the first scan driving circuit 20 away from the display area AA. That is, an orthographic projection of the second scan driving circuit 30 on the base substrate 10 is located on a side of the orthographic projection of the first scan driving circuit 20 on the base substrate 10 away from the display area AA.

Exemplarily, the orthographic projection of the first power trace 60 on the base substrate 10 may cover the orthographic projection of the second scan driving circuit 30 on the base substrate 10. For example, the orthographic projection of the first power trace 60 on the base substrate 10 may completely cover the orthographic projection of the second scan driving circuit 30 on the base substrate 10.

Exemplarily, the orthographic projection of the first power trace 60 on the base substrate 10 may partially overlap the orthographic projection of the first scan driving circuit 20 on the base substrate 10. For example, a width W3 of an overlapping portion of the orthographic projection of the first power trace 60 and the orthographic projection of the first scan driving circuit 20 in the first direction X is more than 40% of a width W60 of the first power trace 60 in the first direction X. The first direction X is a direction from the display area AA to the peripheral area NA. For example, the width W3 of the overlapping portion of the orthographic projection of the first power trace 60 and the orthographic projection of the first scan driving circuit 20 in the first direction X is more than 50% of the width W60 of the first power trace 60 in the first direction X.

Exemplarily, referring to FIG. 3, the first scan driving circuit 20 is spaced apart from the second scan driving circuit 30, and the orthographic projection of the first power trace 60 on the base substrate 10 covers an orthographic projection of a gap 202 between the first scan driving circuit 20 and the second scan driving circuit 30 on the base substrate 10.

Exemplarily, referring to FIG. 4, the first scan driving circuit 20 is spaced apart from the second scan driving circuit 30. The first power trace 60 includes a first sub-trace 60A and a second sub-trace 60B, and the first sub-trace 60A is spaced apart from the second sub-trace 60B. A gap 60C between the first sub-trace 60A and the second sub-trace 60B may expose the gap 202 between the first scan driving circuit 20 and the second scan driving circuit 30. That is, an orthographic projection of the gap 60C between the first sub-trace 60A and the second sub-trace 60B on the base substrate 10 may cover an orthographic projection of the gap 202 between the first scan driving circuit 20 and the second scan driving circuit 30 on the base substrate 10.

Referring to FIG. 3 and FIG. 4, the display substrate 1 further includes a conductive connecting portion 70. The conductive connecting portion 70 is located between the layer where the first power trace 60 is located and the layer where the first electrode 501 is located, so as to electrically connect the first power trace 60 and the first electrode 501. For example, the conductive connecting portion 70 may be located in the fourth conductive layer 7. That is, the conductive connecting portion 70 and the second electrode 502 are located in the same layer and are made of the same material.

Exemplarily, an orthographic projection of the conductive connecting portion 70 on the base substrate 10 may at least partially overlap the orthographic projection of the first scan driving circuit 20 on the base substrate 10, and the orthographic projection of the conductive connecting portion 70 on the base substrate 10 may cover the orthographic projection of the second scan driving circuit 30 on the base substrate 10.

Exemplarily, the conductive connecting portion 70 is in contact with the first power trace 60, and a width of a portion of the first power trace 60 in contact with the conductive connecting portion 70 in the first direction X is more than 50% of the width W60 of the first power trace 60 in the first direction X. For example, referring to FIG. 3, the orthographic projection of the conductive connecting portion 70 on the base substrate 10 substantially covers the orthographic projection of the first power trace 60 on the base substrate 10. In this embodiment, the width of the portion of the first power trace 60 in contact with the conductive connecting portion 70 in the first direction X is more than 80% of the width of the first power trace 60 in the first direction X. In the embodiments of the present disclosure, a contact portion between the first power trace 60 and the conductive connecting portion for electrically connecting the first power trace 60 and the first electrode 501 has a large width, which is beneficial to reduce a contact resistance, so as to facilitate an electrical connection between the first power trace 60 and the first electrode 501.

For example, the orthographic projection of the conductive connecting portion 70 on the base substrate 10 may at least partially overlap the orthographic projection of the first power trace 60 on the base substrate 10. For example, a width of the orthographic projection of the conductive connecting portion 70 on the base substrate 10 in the first direction X may be substantially equal to or greater than the width W60 of the orthographic projection of the first power trace 60 on the base substrate 10 in the first direction X. The conductive connecting portion 70 has a first side edge 70S away from the display area AA, and the first power trace 60 has a first side edge 60S away from the display area AA. The first side edge 70S of the conductive connecting portion 70 and the first side edge 60S of the first power trace 60 are substantially aligned in the thickness direction of the display substrate. That is, an orthographic projection of the first side edge 70S of the conductive connecting portion 70 on the base substrate 10 substantially coincides an orthographic projection of the first side edge 60S of the first power trace 60 on the base substrate 10. Through this arrangement, a large contact area between the conductive connecting portion 70 and the first power trace 60 may be ensured, which is beneficial to reduce the contact resistance, so as to facilitate the electrical connection between the first power trace 60 and the first electrode 501.

In some exemplary embodiments of the present disclosure, the display substrate 1 may further include an auxiliary trace 90 located in the peripheral area NA. The auxiliary trace 90 is located on a side of the second scan driving circuit 30 away from the display area AA and is located on a side of the first power trace 60 close to the base substrate 10, and the auxiliary trace 90 is electrically connected to the first power trace 60. For example, the auxiliary trace 90 may be located in at least one of the first conductive layer 4 and the second conductive layer 5. The first power trace 60 is electrically connected to the auxiliary trace 90 through a via hole or a groove. In this way, a signal such as a VSS voltage may be transmitted through parallel traces located in different conductive layers, which may further reduce an influence of the voltage drop on the transmitted signal.

In some exemplary embodiments of the present disclosure, the display substrate 1 may further include a first barrier component 81 arranged on a side of the first power trace 60 away from the base substrate 10, and an orthographic projection of the first barrier component 81 on the base substrate 10 at least partially overlaps the orthographic projection of the second scan driving circuit 30 on the base substrate 10.

For example, the second scan driving circuit 30 may include an edge portion 302 away from the display area AA, and the orthographic projection of the first barrier component 81 on the base substrate 10 is located on a side of an orthographic projection of the edge portion 302 on the base substrate 10 close to the display area AA.

In some exemplary embodiments of the present disclosure, the display substrate 1 may further include a second barrier component 82 arranged on a side of the first power trace 60 away from the base substrate 10, and the second barrier component 82 is located on a side of the first barrier component 81 away from the display area AA.

For example, referring to FIG. 4, an orthographic projection of the second barrier component 82 on the base substrate 10 at least partially overlaps an orthographic projection of the edge portion 302 of the second scan driving circuit 30 on the base substrate 10.

Referring to FIG. 3 and FIG. 4, the first barrier component 81 is spaced apart from the second barrier component 82. At least a part of the first barrier component 81 may be located in the same layer as the pixel defining layer PDL, and at least a part of the second barrier component 82 may be located in the same layer as the pixel defining layer PDL.

Exemplarily, the display substrate 1 may further include an encapsulation layer TFE arranged on a side of the first barrier component 81 and the second barrier component 82 away from the base substrate 10. For example, the encapsulation layer TFE may include a first encapsulation sub-layer TFE1, a second encapsulation sub-layer TFE2 and a third encapsulation sub-layer TFE3 that are sequentially arranged in a direction away from the base substrate 10. For example, the first encapsulation sub-layer TFE1 and the third encapsulation sub-layer TFE3 may be formed of an inorganic material, and the second encapsulation sub-layer TFE2 may be formed of an organic material.

For example, the first barrier component 81 and the second barrier component 82 may block the organic material from flowing to the outside of the barrier component during a process of forming the second encapsulation sub-layer TFE2. Thus, in the embodiments of the present disclosure, a boundary of the second encapsulation sub-layer TFE2 away from the display area AA is located within the first barrier component 81, or a boundary of the second encapsulation sub-layer TFE2 away from the display area AA is located within the second barrier component 82. Here, the expression "outside" refers to a side away from the display area AA in the first direction X, and the expression "inside" refers to a side close to the display area AA in the first direction X. In addition, the first barrier component 81 and the second barrier component 82 may further prevent water vapor and oxygen from entering an interior of the display substrate, and may reduce a possibility of a crack formed during cutting and opening extending into the display substrate, so as to improve a package reliability.

Figure 10:
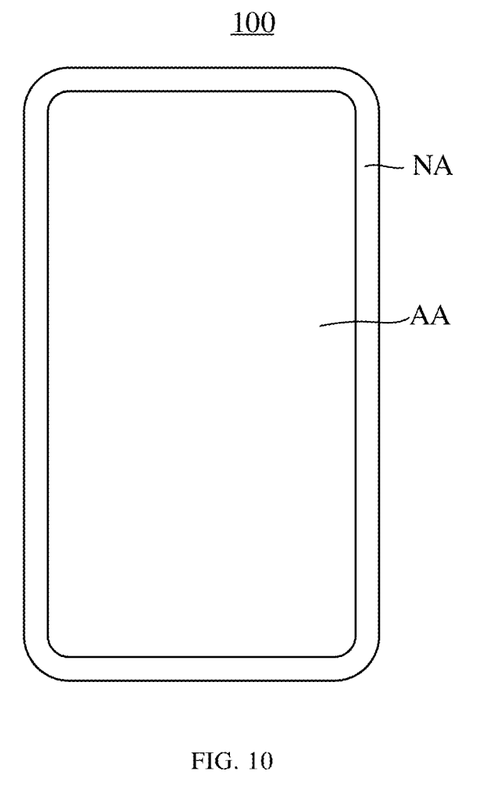
FIG. 10 shows a schematic diagram of a display device according to some exemplary embodiments of the present disclosure.

FIG. 10 shows a schematic diagram of a display device according to some exemplary embodiments of the present disclosure. The display device 100 includes the display substrate described above. For example, it includes the display area AA and the peripheral area NA. The film layer structure in the display area AA and the peripheral area NA may refer to the description of various embodiments described above, which will not be repeated here.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, and so on.

It should be understood that the display device according to the embodiments of the present disclosure may have all the features and advantages of the display substrate described above. The details may refer to the above description.

Although some embodiments of the general technical concept of the present disclosure have been illustrated and described, it should be understood by those of ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:
    a base substrate comprising a display area and a peripheral area located at least on a first side of the display area;
    a plurality of pixel units arranged in the display area of the base substrate, wherein the pixel units comprise a pixel driving circuit and a light emitting device electrically connected to the pixel driving circuit, and the light emitting device comprises a first electrode;
    a first power trace located in the peripheral area and electrically connected to the first electrode; and
    a scan driving circuit arranged on the base substrate and located in the peripheral area, wherein the scan driving circuit comprises a first scan driving circuit for generating a first scan signal and a second scan driving circuit for generating a second scan signal,
    wherein a layer where the first power trace is located is located on a side of a layer where the scan driving circuit is located away from the base substrate; and
    wherein an orthographic projection of the first power trace on the base substrate at least partially overlaps an orthographic projection of the first scan driving circuit on the base substrate, and the orthographic projection of the first power trace on the base substrate at least partially overlaps an orthographic projection of the second scan driving circuit on the base substrate.

2. The display substrate of claim 1, wherein the second scan driving circuit is located on a side of the first scan driving circuit away from the display area, and the orthographic projection of the first power trace on the base substrate covers the orthographic projection of the second scan driving circuit on the base substrate.

3. The display substrate of claim 2, wherein a width of an overlapping portion of the orthographic projection of the first power trace on the base substrate and the orthographic projection of the first scan driving circuit on the base substrate in a first direction is more than 40% of a width of the first scan driving circuit in the first direction, wherein the first direction is a direction from the display area to the peripheral area.

4. The display substrate of claim 1, wherein the first scan driving circuit is spaced apart from the second scan driving circuit, and the orthographic projection of the first power trace on the base substrate covers an orthographic projection of a gap between the first scan driving circuit and the second scan driving circuit on the base substrate.

5. The display substrate of claim 1, wherein:
    the first scan driving circuit is spaced apart from the second scan driving circuit;
    the first power trace comprises a first sub-trace and a second sub-trace, and the first sub-trace is spaced apart from the second sub-trace; and
    a gap between the first sub-trace and the second sub-trace exposes a gap between the first scan driving circuit and the second scan driving circuit.

6. The display substrate of claim 1, further comprising a conductive connecting portion located at least partially between the layer where the first power trace is located and a layer where the first electrode is located, so as to electrically connect the first power trace and the first electrode.

7. The display substrate of claim 6, wherein an orthographic projection of the conductive connecting portion on the base substrate at least partially overlaps the orthographic projection of the first scan driving circuit on the base substrate, and the orthographic projection of the conductive connecting portion on the base substrate covers the orthographic projection of the second scan driving circuit on the base substrate.

8. The display substrate of claim 7, wherein the conductive connecting portion is in contact with the first power trace, and a width of a portion of the first power trace in contact with the conductive connecting portion in the first direction is more than 50% of a width of the first power trace in the first direction, wherein the first direction is a direction from the display area to the peripheral area.

9. The display substrate of claim 1, further comprising a first barrier component arranged on a side of the first power trace away from the base substrate, wherein an orthographic projection of the first barrier component on the base substrate at least partially overlaps the orthographic projection of the second scan driving circuit on the base substrate.

10. The display substrate of claim 9, wherein the second scan driving circuit comprises an edge portion away from the display area, and the orthographic projection of the first barrier component on the base substrate is located on a side of an orthographic projection of the edge portion on the base substrate close to the display area.

11. The display substrate of claim 9, further comprising a second barrier component arranged on a side of the first power trace away from the base substrate, wherein the second barrier component is located on a side of the first barrier component away from the display area; and
    wherein an orthographic projection of the second barrier component on the base substrate at least partially overlaps an orthographic projection of the edge portion of the second scan driving circuit on the base substrate.

12. The display substrate of claim 1, further comprising a conductive trace located in the peripheral area, wherein the conductive trace is located on a side of the second scan driving circuit away from the display area and is located on a side of the first power trace close to the base substrate, and the conductive trace is electrically connected to the first power trace.

13. The display substrate of claim 1, wherein the light emitting device further comprises a second electrode and a light emitting layer arranged between the first electrode and the second electrode, the scan driving circuit comprises at least one thin film transistor arranged on the base substrate, and the thin film transistor comprises an active layer, a gate electrode, a source electrode and a drain electrode; and
    wherein the display substrate further comprises:
        a first conductive layer arranged on a side of the active layer away from the base substrate, wherein the gate electrode is located in the first conductive layer;
        a second conductive layer arranged on a side of the first conductive layer away from the base substrate, wherein the source electrode and the drain electrode are located in the second conductive layer; and a third conductive layer arranged on a side of the second conductive layer away from the base substrate, wherein at least a portion of the second power trace is located in the second conductive layer and/or the third conductive layer.

14. The display substrate of claim 1, wherein the first electrode is a cathode electrode of an organic light emitting device, and the second electrode is an anode electrode of the organic light emitting device.

15. A display device comprising the display substrate of claim 1.

* * * * *